US011316341B2

(12) United States Patent
Lin

(10) Patent No.: US 11,316,341 B2
(45) Date of Patent: Apr. 26, 2022

(54) SURGE PROTECTION POWER SUPPLY CLAMPING CIRCUIT, CHIP AND COMMUNICATION TERMINAL

(71) Applicant: Sheng Lin, Tianjin (CN)

(72) Inventor: Sheng Lin, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 0 days.

(21) Appl. No.: 17/138,571

(22) Filed: Dec. 30, 2020

(65) Prior Publication Data
US 2021/0119446 A1 Apr. 22, 2021

Related U.S. Application Data

(63) Continuation of application No. PCT/CN2019/093621, filed on Jun. 28, 2019.

(51) Int. Cl.
*H02H 9/04* (2006.01)
*H02H 9/02* (2006.01)

(52) U.S. Cl.
CPC ............ *H02H 9/046* (2013.01); *H02H 9/025* (2013.01); *H02H 9/041* (2013.01)

(58) Field of Classification Search
CPC ........ H02H 9/046; H02H 9/025; H02H 9/041; H02H 9/045; H01L 27/0285; H01L 27/0292; H02M 1/32

(Continued)

(56) References Cited

U.S. PATENT DOCUMENTS 6,249,410 B1   6/2001  Ker et al.
6,724,603 B2 * 4/2004  Miller ................ H01L 27/0251
                                                              361/111

(Continued)

FOREIGN PATENT DOCUMENTS

CN         1542961 A      11/2004
CN       101707368 A       5/2010
(Continued)

OTHER PUBLICATIONS

EP1982573 Extended European Search Report dated Jul. 6, 2021.

*Primary Examiner* — Dharti H Patel
(74) *Attorney, Agent, or Firm* — George Guosheng Wang; United States Research and Patent Firm

(57) ABSTRACT

Disclosed are a surge protection power supply clamping circuit, a chip and a communication terminal. The power supply clamping circuit comprises at least one driving unit and discharging unit; the discharging units are connected to the corresponding driving units respectively, and the driving units are connected to the same time delay unit respectively; the time delay units and the discharging units are connected to a power supply voltage and a ground line respectively. The driving units or the discharging units are sequentially controlled in the power supply voltage wiring direction, so that the sum values of an equivalent conduction resistance and an equivalent metal wiring resistance of respective discharging units are the same, and therefore, the uneven conduction of an NMOS transistor caused by different metal wiring resistances due to different metal wiring lengths of the NMOS transistor of each discharging unit can be counteracted.

12 Claims, 3 Drawing Sheets

(58) Field of Classification Search
USPC .......................................................... 361/56
See application file for complete search history.

(56) References Cited

U.S. PATENT DOCUMENTS

| | | | |
|---|---|---|---|
| 2005/0146380 A1 | 7/2005 | Hayashi | |
| 2009/0303645 A1* | 12/2009 | Sasaki | H01L 23/60 361/56 |
| 2009/0323236 A1* | 12/2009 | Morishita | H01L 27/0251 361/56 |
| 2010/0271740 A1* | 10/2010 | Galy | H01L 27/0259 361/56 |
| 2014/0063665 A1* | 3/2014 | Chen | H02H 9/046 361/56 |
| 2015/0084161 A1 | 3/2015 | Worley et al. | |

FOREIGN PATENT DOCUMENTS

| | | |
|---|---|---|
| CN | 202917963 U | 5/2013 |
| WO | 2001078148 A1 | 10/2001 |
| WO | 2008027663 A2 | 3/2008 |
| WO | 2008027663 A3 | 11/2008 |

* cited by examiner

SURGE PROTECTION POWER SUPPLY CLAMPING CIRCUIT, CHIP AND COMMUNICATION TERMINAL

BACKGROUND

Technical Field

The present invention relates to a surge protection power supply clamping circuit (power supply clamping circuit for short below), and also relates to a chip including the power supply clamping circuit and a corresponding communication terminal.

Related Art

In integrated circuit design, a surge is a strong pulse generated at the moment when the power supply is just turned on. A chip may be burned out at the moment of a surge. Therefore, it is necessary to give priority to the surge problem when the chip is designed. In the related art, a working principle of multi-level protection and gradual reduction is generally adopted to resolve the surge problem for the chip.

As shown in FIG. 1, the multi-level protection circuit usually includes a first-level protection circuit and a power supply clamping circuit inside the protected chip. The first-level protection circuit may absorb an instantaneous large current by using a transient voltage suppressor, and clamp voltages at two ends to a predetermined value, to protect the following circuit elements from the impact of a transient high-voltage spike. The power supply clamping circuit is disposed between a power supply voltage and a ground cable, and the instantaneous large current is discharged through a plurality of NMOS transistors in the circuit, to prevent the chip from burnout due to the instantaneous large current.

In the power supply clamping circuit, the conduction uniformity of the NMOS transistor affects the surge protection capability. Therefore, generally, a spacing between a drain electrode and a gate electrode of the NMOS transistor is increased to improve the conduction uniformity. However, this approach increases the area of the chip and lower the integration level. Alternatively, a silicide protection layer is added to the NMOS transistor to improve the conduction uniformity. However, this approach significantly increases the cost.

SUMMARY

The primary technical problem to be resolved by the present invention is to provide a surge protection power supply clamping circuit.

Another technical problem to be resolved by the present invention is to provide a chip including the power supply clamping circuit and a corresponding communication terminal.

To achieve the foregoing objective of the present invention, the following technical solutions are used in the present invention.

According to a first aspect of the embodiments of the present invention, a surge protection power supply clamping circuit is provided, including at least one drive unit and at least one discharge unit, where the discharge units are connected to the corresponding drive units respectively, the drive units are connected to the same delay unit, and the delay unit and the discharge units are each connected to a power supply voltage and a ground cable respectively; and the drive units or the discharge units are sequentially controlled in a wiring direction of the power supply voltage, so that each discharge unit has the same sum of an equivalent conduction resistance and an equivalent metal wiring resistance.

Preferably, the delay unit includes a resistor module and a capacitor module, one end of the resistor module is connected to the power supply voltage, the other end of the resistor module is connected to one end of the capacitor module and input ends of the drive units, and the other end of the capacitor module is connected to the ground cable.

Preferably, when the drive units are sequentially controlled in the wiring direction of the power supply voltage so that each discharge unit has the same sum of the equivalent conduction resistance and the equivalent metal wiring resistance, each drive unit is formed by an odd number of inverters connected in series, an input end of a first inverter is used as the input end of the drive unit, and an output end of a last inverter is used as an output end of the drive unit;

each discharge unit includes the same quantity of NMOS transistors, the input ends of the drive units are connected to the other end of the resistor module, the output ends of the drive units are connected to gate electrodes of the NMOS transistors of the corresponding discharge units respectively, drain electrodes of the NMOS transistors are connected to the power supply voltage respectively, and source electrodes of the NMOS transistors are connected to the ground cable; and sizes of the last inverters in the drive units sequentially increase in the wiring direction of the power supply voltage.

Preferably, when the discharge units are sequentially controlled in the wiring direction of the power supply voltage so that each discharge unit has the same sum of the equivalent conduction resistance and the equivalent metal wiring resistance, each drive unit is formed by an odd number of inverters of the same size connected in series, an input end of a first inverter is used as the input end of the drive unit, and an output end of a last inverter is used as an output end of the drive unit;

each discharge unit includes at least one NMOS transistor, the input ends of the drive units are connected to the other end of the resistor module, the output ends of the drive units are connected to gate electrodes of the NMOS transistors of the corresponding discharge units respectively, drain electrodes of the NMOS transistors are connected to the power supply voltage, and source electrodes of the NMOS transistors are connected to the ground cable; and quantities of the NMOS transistors in the discharge units sequentially decrease in the wiring direction of the power supply voltage.

According to a second aspect of the embodiments of the present invention, a surge protection power supply clamping circuit is provided, including at least one delay unit, at least one drive unit, and at least one discharge unit, where the delay units and the discharge units are each connected to a power supply voltage and a ground cable, the delay units are connected to the corresponding drive units respectively, and the drive units are connected to the corresponding discharge units respectively; and the delay units are sequentially controlled in a wiring direction of the power supply voltage, so that each discharge unit has the same sum of an equivalent conduction resistance and an equivalent metal wiring resistance.

Preferably, the delay unit includes a resistor module and a capacitor module, one end of the resistor module is connected to the power supply voltage, the other end of the resistor module is connected to one end of the capacitor module and an input end of the corresponding drive unit, and the other end of the capacitor module is connected to the ground cable.

Preferably, the resistor module includes at least one resistor, and when there are a plurality of resistors, the resistors are connected in series; and the capacitor module includes at least one capacitor, and when there are a plurality of capacitors, the capacitors are connected in parallel.

Preferably, when the delay units are sequentially controlled in the wiring direction of the power supply voltage so that each discharge unit has the same sum of the equivalent conduction resistance and the equivalent metal wiring resistance, each drive unit is formed by an odd number of inverters of the same size connected in series, an input end of a first inverter is used as the input end of the drive unit, and an output end of a last inverter is used as an output end of the drive unit;

each discharge unit includes the same quantity of NMOS transistors, the input ends of the drive units are connected to the other ends of the resistor modules of the corresponding delay units respectively, the output ends of the drive units are connected to gate electrodes of the NMOS transistors of the corresponding discharge units respectively, drain electrodes of the NMOS transistors are connected to the power supply voltage, and source electrodes of the NMOS transistors are connected to the ground cable; and equivalent resistances of the resistor modules in the delay units sequentially increase in the wiring direction of the power supply voltage; or equivalent capacitances of the capacitor modules in the delay units sequentially increase in the wiring direction of the power supply voltage; or the equivalent resistances of the resistor modules and the equivalent capacitances of the capacitor modules in the delay units simultaneously increase sequentially in the wiring direction of the power supply voltage.

Preferably, the resistor is replaced with an NMOS transistor or a PMOS transistor that operates in a linear region; and the capacitor is replaced with a MOS capacitor.

According to a third aspect of the embodiments of the present invention, a chip is provided, including the foregoing surge protection power supply clamping circuit.

According to a fourth aspect of the embodiments of the present invention, a communication terminal is provided, including the foregoing surge protection power supply clamping circuit.

According to the power supply clamping circuit provided in the present invention, in the wiring direction of the power supply voltage, the drive units or the discharge units are sequentially controlled or the delay units are sequentially controlled, so that each discharge unit has the same sum of the equivalent conduction resistance and the equivalent metal wiring resistance, to counteract the uneven conduction of the NMOS transistors that is caused by different metal wiring resistances due to different metal wiring lengths of the NMOS transistors in discharge units, and improve the conduction uniformity of the discharge units, thereby improving the surge protection capability of the power supply clamping circuit and improving the reliability of the electronic product.

DETAILED DESCRIPTION

The technical content of the present invention is further described in detail below with reference to the accompanying drawings and specific embodiments.

In an existing power supply clamping circuit, a plurality of NMOS transistors are used as the main surge protection device. An instantaneous large current is discharged by using a strong instantaneous-large-current discharge capability of the NMOS transistor, to prevent a chip from burnout due to the instantaneous large current. Specifically, when an instantaneous large current occurs, it needs to be ensured that all the NMOS transistors in the power supply clamping circuit are turned on simultaneously, to discharge the instantaneous large current to the ground. Distances from the NMOS transistors to a power supply voltage are different, and metal wiring lengths from the NMOS transistors to the power supply voltage are also different. Reference may be made to the following formula:

$$R = R_s \frac{L}{W} \tag{1}$$

Figure 1:
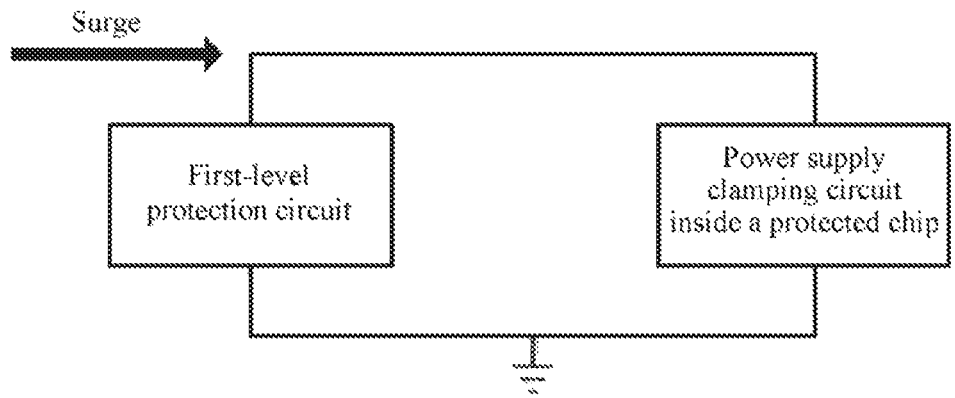
FIG. 1 is a principle diagram of an existing multi-level protection circuit.
Figure 2:
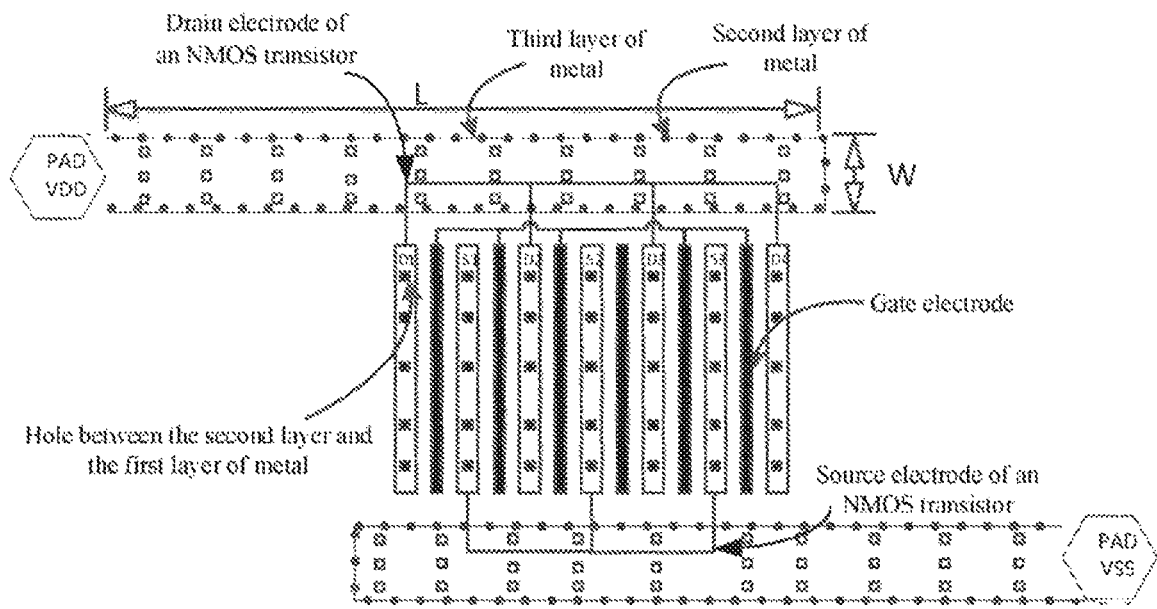
FIG. 2 is a schematic diagram of a layout structure of a plurality of NMOS transistors connected in an existing power supply clamping circuit.

$R_s$ represents a sheet resistance value of each layer of metal wiring from each NMOS transistor to the power supply voltage, L represents a length of each layer of metal wiring from each NMOS transistor to the power supply voltage, and W represents a width of each layer of metal wiring from each NMOS transistor to the power supply voltage. It can be learned from formula (1) that metal wiring resistances R from the NMOS transistors to the power supply voltage are different. As shown in FIG. 2, in an existing power supply clamping circuit, the metal wiring resistance from each NMOS transistor to the power supply voltage is a metal wiring resistance from each NMOS transistor to a pad of the power supply voltage VDD. In addition, the NMOS transistors are arranged in the same manner, so that in a wiring direction of the power supply voltage, the metal wiring resistances of the NMOS transistors to the pad of the power supply voltage VDD sequentially increase. When a surge occurs, an NMOS transistor with a small metal wiring resistance and close to the pad of the power supply voltage VDD is selected to be turned on first. In this case, if the energy is high enough, the turned-on NMOS transistor may be burned out while other NMOS transistors are not turned on at this time, resulting in an inadequate surge protection effect of the existing power supply clamping circuit.

Therefore, the present invention provides a power supply clamping circuit to solve the problem of an inadequate surge protection effect caused by sequentially increasing metal wiring resistances in a case that the metal wiring resistances of a plurality of NMOS transistors of a power supply clamping circuit sequentially increase, that is, the metal wiring resistances of the NMOS transistors to the pad of the power supply voltage sequentially increase.

The power supply clamping circuit includes at least one delay unit, at least one drive unit, and at least one discharge unit. The delay units and the discharge units are each connected to a power supply voltage and a ground cable, and the discharge units are connected to the corresponding drive units respectively. When the drive units are connected to the same delay unit, the drive units or the discharge units are sequentially controlled in a wiring direction of the power supply voltage, so that each discharge unit has the same sum of an equivalent conduction resistance and an equivalent metal wiring resistance, to improve the conduction uniformity of the discharge units, thereby improving the surge protection capability of the power supply clamping circuit. Alternatively, when the drive units are connected to the corresponding delay units respectively, the delay units are sequentially controlled in the wiring direction of the power supply voltage, so that each discharge unit has the same sum of the equivalent conduction resistance and the equivalent metal wiring resistance, to improve the conduction uniformity of the discharge units, thereby improving the surge protection capability of the power supply clamping circuit. The equivalent conduction resistance of each discharge unit refers to a sum of conduction resistances of the NMOS transistors in each discharge unit, the equivalent metal wiring resistance of each discharge unit refers to a sum of metal wiring resistances of the NMOS transistors in each discharge unit, and the metal wiring resistance of each NMOS transistor in each discharge unit refers to a resistance of metal wiring from each NMOS transistor in each discharge unit to the power supply voltage.

The structure and working principle of the power supply clamping circuit provided in the present invention are described in detail below with reference to FIG. 4 to FIG. 6 by using the following embodiments.

Embodiment 1

A power supply clamping circuit provided in this embodiment includes at least one drive unit and at least one discharge unit, and a delay unit. The delay unit and the discharge units are each connected to a power supply voltage VDD and a ground cable. The discharge units are connected to the corresponding drive units respectively, and the drive units are connected to the delay unit. The delay unit includes a resistor module and a capacitor module, one end of the resistor module is connected to the power supply voltage, the other end of the resistor module is connected to one end of the capacitor module and input ends of the drive units, and the other end of the capacitor module is connected to the ground cable. The resistor module includes at least one resistor, and when there are a plurality of resistors, the resistors are connected in series. The capacitor module includes at least one capacitor, and when there are a plurality of capacitors, the capacitors are connected in parallel. Each drive unit is formed by an odd number of inverters connected in series. In addition, after the odd number of inverters are connected in series, an input end of a first inverter is used as the input end of the drive unit, and an output end of a last inverter is used as an output end of the drive unit. Therefore, the input ends of the drive units are connected to the other end of the resistor module, and the output ends of the drive units are connected to the corresponding discharge units respectively. Each discharge unit includes the same quantity of NMOS transistors. Gate electrodes of the NMOS transistors are connected to the output ends of the corresponding drive units respectively, drain electrodes of the NMOS transistors are connected to the power supply voltage VDD, and source electrodes of the NMOS transistors are connected to the ground cable.

Each discharge unit includes the same quantity of NMOS transistors. Therefore, each discharge unit has the same parasitic capacitance and threshold voltage. Reference may be made to the following formula:

$$Q=CU=It \qquad (2)$$

Figure 3:
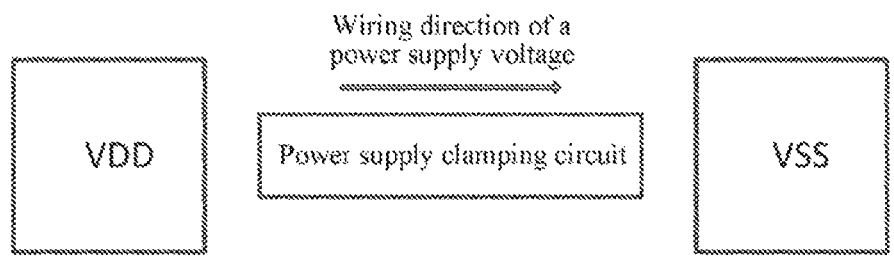
FIG. 3 is a schematic diagram of a wiring direction of a power supply voltage in a power supply clamping circuit according to the present invention.

Q represents a charge amount of each discharge unit, C represents a parasitic capacitance of each discharge unit, U represents a threshold voltage of each discharge unit, I represents a charging current for a gate electrode of each discharge unit, and t represents a capacitor charging time of each discharge unit. It can be learned from the formula that when each discharge unit has the same threshold voltage and the same parasitic capacitance, a greater charging current for the gate electrode of the discharge unit indicates a shorter capacitor charging time of the discharge unit and a stronger conduction capability of the discharge unit. Because parasitic capacitances of the NMOS transistors in the discharge units are different due to crafts of the NMOS transistors, inverters of different sizes may be selected according to the crafts and quantities of the NMOS transistors in the discharge units, to improve the conduction uniformity of the equivalent NMOS transistors (respective sums of the NMOS transistors) in the discharge units by using inverters with different driving capabilities. Therefore, in the wiring direction of the power supply voltage (as shown in FIG. 3), sizes of the last inverters in the drive units are sequentially increased, to sequentially increase equivalent charging currents for the discharge units (where the equivalent charging current is a sum of charging currents for the gate electrodes of the NMOS transistors in the discharge unit), and correspondingly, sequentially decrease equivalent conduction resistances of the discharge units (where the equivalent conduction resistance is a sum of conduction resistances of the NMOS transistors in each discharge unit). In the wiring direction of the power supply voltage, the equivalent metal wiring resistances of the discharge units (where the equivalent metal wiring resistance is a sum of metal wiring resistances of the NMOS transistors in each discharge unit) sequentially increase, and the metal wiring resistance of each NMOS transistor in each discharge unit may be obtained through calculation according to formula (1). Therefore, the sizes of the last inverters in the drive units may be sequentially increased according to the equivalent metal wiring resistances of the discharge units, so that each discharge unit has the same sum of the equivalent conduction resistance and the equivalent metal wiring resistance, to improve the conduction uniformity of the equivalent NMOS transistors (respective sums of the NMOS transistors) in the discharge units, thereby improving the surge protection capability of the power supply clamping circuit.

The structure and working principle of the power supply clamping circuit provided in this embodiment are described in detail below by using an example in which the power supply clamping circuit includes three drive units, three discharge units, and one delay unit, the delay unit includes a resistor and a capacitor, each drive unit is formed by an odd number of inverters connected in series, an input end of a first inverter is used as an input end of the drive unit, an output end of a last inverter is used as an output end of the drive unit, and each discharge unit includes one same NMOS transistor.

Figure 4:
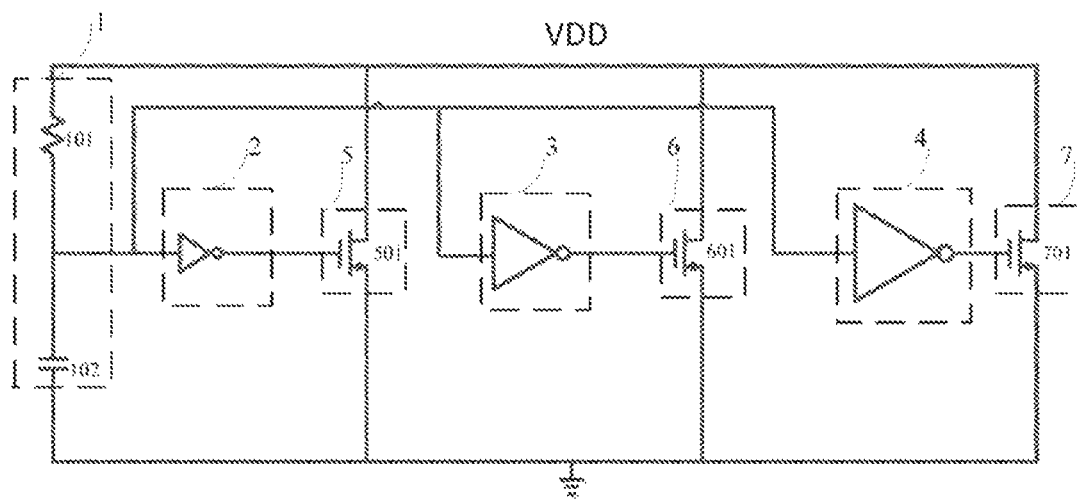
FIG. 4 is a principle diagram of a power supply clamping circuit according to Embodiment 1 of the present invention.

As shown in FIG. 4, the power supply clamping circuit provided in this embodiment includes a delay unit 1, a first drive unit 2, a second drive unit 3, a third drive unit 4, a first discharge unit 5, a second discharge unit 6, and a third discharge unit 7. The delay unit 1 includes a resistor 101 and a capacitor 102. The first drive unit 2 is formed by an odd number of inverters connected in series, the second drive unit 3 is formed by an odd number of inverters connected in series, and the third drive unit 4 is formed by an odd number of inverters connected in series. The first discharge unit 5 includes an NMOS transistor 501, the second discharge unit 6 includes an NMOS transistor 601, and the third discharge unit 7 includes an NMOS transistor 701. Specific connection relationships between the parts of the power supply clamping circuit are as follows: one end of the resistor 101 and drain electrodes of the NMOS transistor 501, the NMOS transistor 601, and the NMOS transistor 701 are each connected to a power supply voltage VDD, the other end of the resistor 101 is connected to one end of the capacitor 102 and input ends of the first drive unit 2, the second drive unit 3, and the third drive unit 4, an output end of the first drive unit 2 is connected to a gate electrode of the NMOS transistor 501, an output end of the second drive unit 3 is connected to a gate electrode of the NMOS transistor 601, an output end of the third drive unit 4 is connected to a gate electrode of the NMOS transistor 701, and the other end of the capacitor 102 and source electrodes of the NMOS transistor 501, the NMOS transistor 601, and the NMOS transistor 701 are each connected to a ground cable. Therefore, according to metal wiring resistances of the NMOS transistor 501, the NMOS transistor 601, and the NMOS transistor 701 that are obtained from formula (1), in a wiring direction of the power supply voltage, sizes of last inverters in the first drive unit 2, the second drive unit 3, and the third drive unit 4 are sequentially increased, that is, the size of the last inverter in the first drive unit 2 is smaller than the size of the last inverter in the second drive unit 3, and the size of the last inverter in the second drive unit 3 is smaller than the size of the last inverter in the third drive unit 4, so that a sum of the conduction resistance and the metal wiring resistance of the NMOS transistor 501, a sum of the conduction resistance and the metal wiring resistance of the NMOS transistor 601, and a sum of the conduction resistance and the metal wiring resistance of the NMOS transistor 701 are the same, to improve the conduction uniformity of the NMOS transistor 501, the NMOS transistor 601, and the NMOS transistor 701, thereby improving the surge protection capability of the power supply clamping circuit.

Embodiment 2

A power supply clamping circuit provided in this embodiment includes at least one drive unit, at least one discharge unit, and a delay unit. The delay unit and the discharge units are each connected to a power supply voltage VDD and a ground cable. The discharge units are connected to the corresponding drive units respectively, and the drive units are connected to the delay unit. The delay unit includes a resistor module and a capacitor module, one end of the resistor module is connected to the power supply voltage, the other end of the resistor module is connected to one end of the capacitor module and input ends of the drive units, and the other end of the capacitor module is connected to the ground cable. The resistor module includes at least one resistor, and when there are a plurality of resistors, the resistors are connected in series. The capacitor module includes at least one capacitor, and when there are a plurality of capacitors, the capacitors are connected in parallel. Each drive unit is formed by an odd number of inverters of the same size connected in series. In addition, after the odd number of inverters are connected in series, an input end of a first inverter is used as the input end of the drive unit, and an output end of a last inverter is used as an output end of the drive unit. The input ends of the drive units are connected to the other end of the resistor module, and the output ends of the drive units are connected to the corresponding discharge units respectively. Each discharge unit includes at least one NMOS transistor, gate electrodes of the NMOS transistors are connected to the output ends of the corresponding drive units respectively, drain electrodes of the NMOS transistors are connected to the power supply voltage VDD, and source electrodes of the NMOS transistors are connected to the ground cable.

Because each drive unit is formed by an odd number of inverters of the same size connected in series, driving capabilities of the drive units are the same, that is, charging currents for the gate electrodes of the NMOS transistors in the discharge units are the same. It can be learned from formula (2) that, in the case of the same threshold voltage and the drive units with the same driving capability, a smaller equivalent parasitic capacitance of each discharge unit (namely, a sum of parasitic capacitances of the NMOS transistors in each discharge unit) indicates a stronger conduction capability of the discharge unit. Therefore, to counteract the uneven conduction of the equivalent NMOS transistors that is caused by different metal wiring resistances (namely, a sum of metal wiring resistances of the NMOS transistors in each discharge unit) due to different metal wiring lengths of the NMOS transistors in the discharge unit, according to the metal wiring resistance of the equivalent NMOS transistor in each discharge unit (namely, a sum of the metal wiring resistances of the NMOS transistors in each discharge unit) obtained based on formula (1), quantities of the NMOS transistors in the discharge units may be sequentially reduced in a wiring direction of the power supply voltage VDD, to sequentially reduce the equivalent parasitic capacitances of the discharge units, and sequentially reduce equivalent conduction resistances of the discharge units (where the equivalent conduction resistance is a sum of conduction resistances of the NMOS transistors in each discharge unit), so that each discharge unit has the same sum of the equivalent conduction resistance and the equivalent metal wiring resistance, to improve the conduction uniformity of the discharge units (respective sums of the NMOS transistors), thereby improving the surge protection capability of the power supply clamping circuit.

The structure and working principle of the power supply clamping circuit provided in this embodiment are described in detail below by using an example in which the power supply clamping circuit includes three drive units, three discharge units, and one delay unit, the delay unit includes a resistor and a capacitor, each drive unit is formed by an odd number of inverters of the same size connected in series, an input end of a first inverter is used as an input end of the drive unit, an output end of a last inverter is used as an output end of the drive unit, and each discharge unit includes at least one same NMOS transistor.

Figure 5:
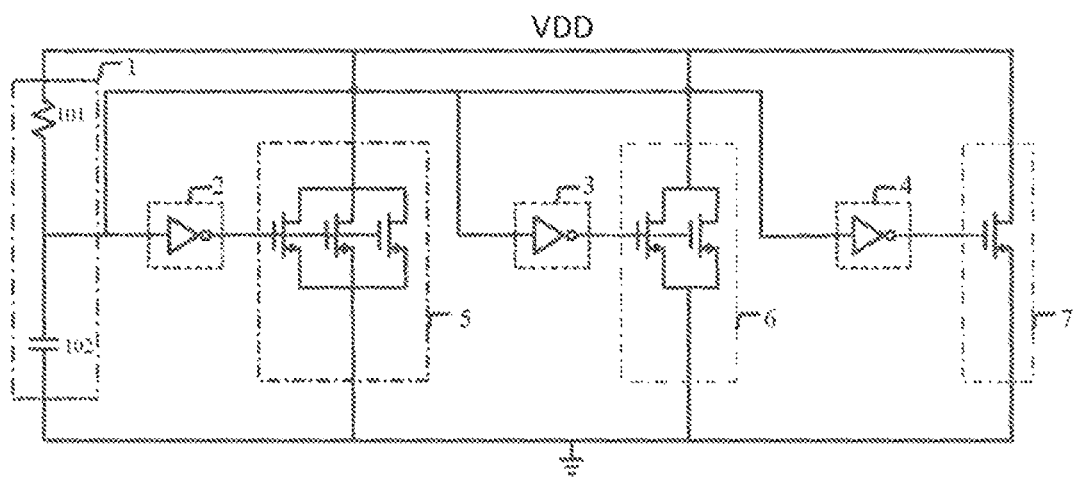
FIG. 5 is a principle diagram of a power supply clamping circuit according to Embodiment 2 of the present invention.

As shown in FIG. 5, the power supply clamping circuit provided in this embodiment includes a delay unit 1, a first drive unit 2, a second drive unit 3, a third drive unit 4, a first discharge unit 5, a second discharge unit 6, and a third discharge unit 7. The delay unit 1 includes a resistor 101 and a capacitor 102. Each of the first drive unit 2, the second drive unit 3, and the third drive unit 4 is formed by an odd number of inverters of the same size connected in series. The first discharge unit 5 includes three NMOS transistors 501, the second discharge unit 6 includes two NMOS transistors 601, and the third discharge unit 7 includes one NMOS transistor 701. Specific connection relationships between the parts of the power supply clamping circuit are as follows: one end of the resistor 101 and drain electrodes of the NMOS transistors 501, the NMOS transistors 601, and the NMOS transistor 701 are connected to a power supply voltage VDD; the other end of the resistor 101 is connected to one end of the capacitor 102 and input ends of the first drive unit 2, the second drive unit 3, and the third drive unit 4; an output end of the first drive unit 2 is connected to gate electrodes of the NMOS transistors 501, an output end of the second drive unit 3 is connected to gate electrodes of the NMOS transistors 601, and an output end of the third drive unit 4 is connected to a gate electrode of the NMOS transistor 701; the other end of the capacitor 102 and source electrodes of the NMOS transistors 501, the NMOS transistors 601, and the NMOS transistor 701 are connected to a ground cable.

Therefore, according to metal wiring resistances of the NMOS transistor 501, the NMOS transistor 601, and the NMOS transistor 701 that are obtained based on formula (1), in a wiring direction of the power supply voltage, quantities of the NMOS transistors in the first discharge unit 5, the second discharge unit 6, and the third discharge unit 7 are sequentially reduced, to sequentially reduce the equivalent parasitic capacitances of the discharge units (namely, respective sums of parasitic capacitances of the NMOS transistors in the discharge units), and sequentially reduce the equivalent conduction resistances of the discharge units (namely, respective sums of conduction resistances of the NMOS transistors in the discharge units), so that each discharge unit has the same sum of the equivalent conduction resistance and the equivalent metal wiring resistance (namely, a sum of metal wiring resistances of the NMOS transistors in each discharge unit), to improve the conduction uniformity of the discharge units, thereby improving the surge protection capability of the power supply clamping circuit.

Embodiment 3

The power supply clamping circuit provided in this embodiment includes at least one delay unit, at least one drive unit, and at least one discharge unit. The delay units and the discharge units are each connected to a power supply voltage VDD and a ground cable. The discharge units are connected to the corresponding drive units respectively, and the drive units are connected to the corresponding delay units respectively. Each delay unit includes a resistor module and a capacitor module, one end of the resistor module is connected to the power supply voltage, the other end of the resistor module is connected to one end of the capacitor module and the corresponding drive unit, and the other end of the capacitor module is connected to the ground cable. The resistor module includes at least one resistor, and when there are a plurality of resistors, the resistors are connected in series. The capacitor module includes at least one capacitor, and when there are a plurality of capacitors, the capacitors are connected in parallel. Each drive unit is formed by an odd number of inverters of the same size connected in series. In addition, after the odd number of inverters are connected in series, an input end of a first inverter is used as an input end of the drive unit, and an output end of a last inverter is used as an output end of the drive unit. The input end of each drive unit is connected to the other end of the resistor module, and the output end of each drive unit is connected to the corresponding discharge unit. Each discharge unit includes the same quantity of NMOS transistors. Gate electrodes of the NMOS transistors are connected to the output ends of the corresponding drive units respectively, drain electrodes of the NMOS transistors are connected to the power supply voltage VDD, and source electrodes of the NMOS transistors are connected to the ground cable.

Therefore, to counteract the uneven conduction of the NMOS transistors that is caused by different metal wiring resistances due to different metal wiring lengths of the NMOS transistors in the discharge units, according to the equivalent metal wiring resistance of each discharge unit (namely, a sum of the metal wiring resistances of the NMOS transistors in each discharge unit) obtained based on formula (1), in a wiring direction of the power supply voltage VDD, equivalent resistances of the resistor modules in the delay units may be sequentially increased, or equivalent capacitances of the capacitor modules in the delay units may be sequentially increased, or the equivalent resistances of the resistor modules and the equivalent capacitances of the capacitor modules in the delay units may be simultaneously increased sequentially, to slow down voltage variation on the capacitor in the capacitor module, and sequentially reduce equivalent conduction resistances of the discharge units (namely, respective sums of conduction resistances of the NMOS transistors in the discharge units), so that each discharge unit has the same sum of the equivalent conduction resistance and the equivalent metal wiring resistance, to improve the conduction uniformity of the discharge units, thereby improving the surge protection capability of the power supply clamping circuit.

The structure and working principle of the power supply clamping circuit provided in this embodiment are described in detail below by using an example in which the power supply clamping circuit includes two delay units, two drive units, and two discharge units, each delay unit includes at least one resistor and at least one capacitor, each drive unit is formed by an odd number of inverters of the same size connected in series, an input end of a first inverter is used as an input end of the drive unit, an output end of a last inverter is used as an output end of the drive unit, and each discharge unit includes one same NMOS transistor.

Figure 6:
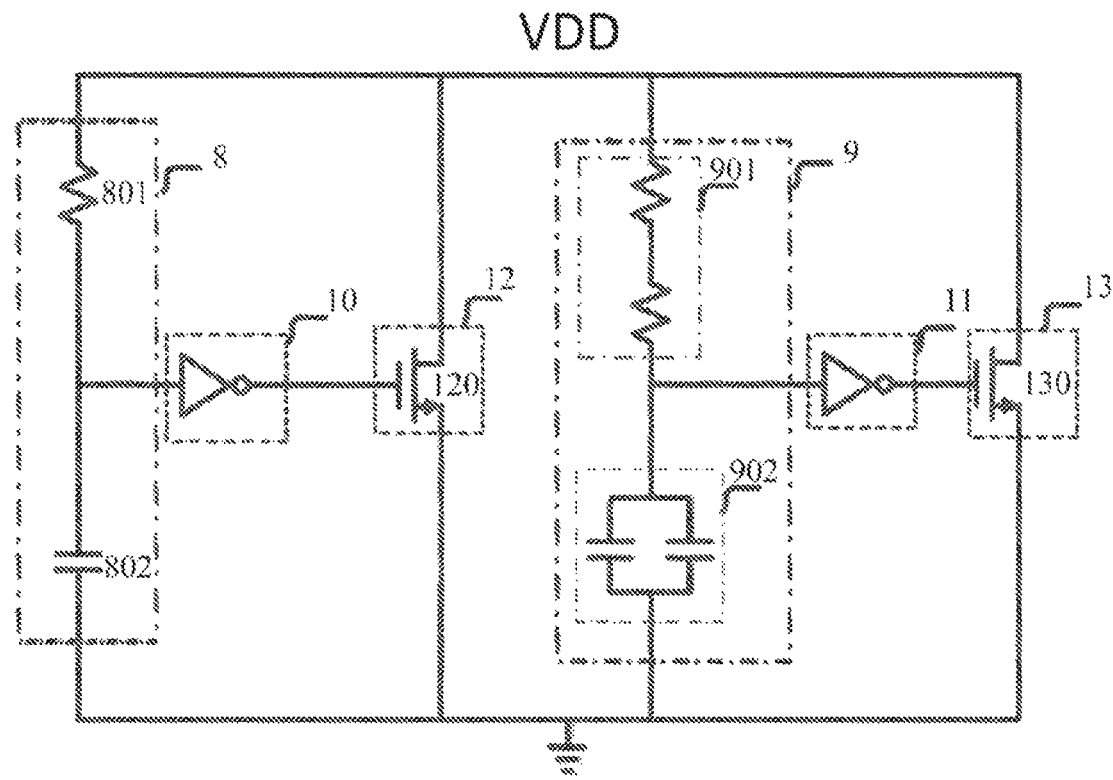
FIG. 6 is a principle diagram of a power supply clamping circuit according to Embodiment 3 of the present invention.

As shown in FIG. 6, the power supply clamping circuit provided in this embodiment includes a first delay unit 8, a second delay unit 9, a first drive unit 10, a second drive unit 11, a first discharge unit 12, and a second discharge unit 13. The first delay unit 8 includes a resistor 801 and a capacitor 802. The second delay unit 9 includes a resistor module 901 and a capacitor module 902. The resistor module is formed by two resistors connected in series, and the capacitor module 902 is formed by two capacitors connected in parallel. The first drive unit 10 and the second drive unit 11 are each formed by an odd number of inverters of the same size connected in series. The first discharge unit 12 includes an NMOS transistor 120, and the second discharge unit 13 includes an NMOS transistor 130. Specific connection relationships between the parts of the power supply clamping circuit are as follows: one end of the resistor 801 and the resistor module 901, and drain electrodes of the NMOS transistor 120 and the NMOS transistor 130 are connected to a power supply voltage VDD, the other end of the resistor 801 is connected to one end of the capacitor 802 and an input end of the first drive unit 10, an output end of the first drive unit 10 is connected to a gate electrode of the NMOS transistor 120, the other end of the resistor module 901 is connected to one end of the capacitor module 902 and an input end of the second drive unit 11, an output end of the second drive unit 11 is connected to a gate electrode of the NMOS transistor 130, and the other end of the capacitor 802 and source electrodes of the NMOS transistor 120 and the NMOS transistor 130 are connected to a ground cable.

Therefore, to counteract the uneven conduction of the NMOS transistors that is caused by different metal wiring resistances due to different metal wiring lengths of the NMOS transistors in the discharge units, according to the equivalent metal wiring resistance of each discharge unit (a sum of the metal wiring resistances of the NMOS transistors in each discharge unit) obtained based on formula (1), equivalent resistances of the resistor modules in the first delay unit 8 and the second delay unit 9 may be sequentially increased in a wiring direction of the power supply voltage VDD, that is, resistance values of the resistor 801 and the resistor module 901 (a total resistance of two resistors connected in series) are sequentially increased, to slow down voltage variation on the capacitor in the capacitor module. Alternatively, equivalent capacitances of the capacitor modules in the first delay unit 8 and the second delay unit 9 are sequentially increased, that is, capacitance values of the capacitor 802 and the capacitor module 902 (a total capacitance of two capacitors connected in parallel) are sequentially increased, to slow down voltage variation on the capacitor in the capacitor module. Alternatively, the equivalent resistances of the resistor modules and the equivalent capacitances of the capacitor modules in the first delay unit 8 and the second delay unit 9 are simultaneously increased sequentially, that is, the equivalent resistances of the resistor 801 and the resistor module 901 are sequentially increased, and the equivalent capacitances of the capacitor 802 and the capacitor module 902 are sequentially increased, to slow down voltage variation on the capacitor in the capacitor module. By slowing the voltage variation on the capacitor in the capacitor module, conduction resistances of the NMOS transistor 120 and the NMOS transistor 130 are sequentially reduced, so that a sum of the conduction resistance and the metal wiring resistance of the NMOS transistor 120 and a sum of the conduction resistance and the metal wiring resistance of the NMOS transistor 130 are the same, to improve the conduction uniformity of the NMOS transistor 120 and the NMOS transistor 130, thereby improving the surge protection capability of the power supply clamping circuit.

Figure 7:
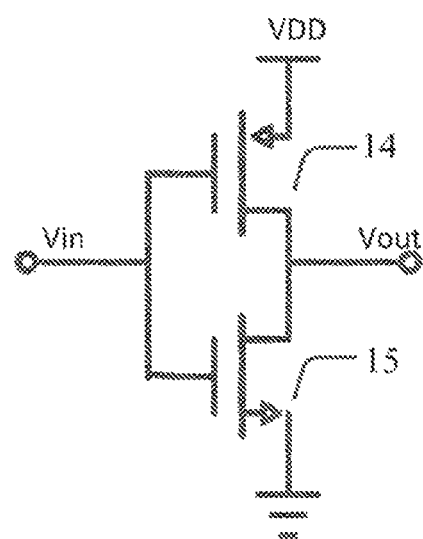
FIG. 7 is a circuit principle diagram of an inverter in a power supply clamping circuit according to the present invention.

As shown in FIG. 7, in Embodiments 1 to 3, the inverter in each drive unit includes a PMOS transistor 14 and an NMOS transistor 15. Gate electrodes of the PMOS transistor 14 and the NMOS transistor 15 are connected together and used as an input end of the inverter, drain electrodes of the PMOS transistor 14 and the NMOS transistor 15 are connected together and used as an output end of the inverter, a source electrode of the PMOS transistor 14 is connected to the power supply voltage VDD, and a source electrode of the NMOS transistor 15 is connected to the ground cable. The inverter can drive the NMOS transistor in the corresponding discharge unit to be turned on, to discharge a large current when a surge occurs.

In the power supply clamping circuit, the resistor in the delay unit may be replaced with an NMOS transistor or a PMOS transistor that operates in a linear region, and the capacitor in the delay unit may be replaced with a MOS capacitor.

According to the power supply clamping circuit provided in the present invention, in the wiring direction of the power supply voltage, the drive units or the discharge units are sequentially controlled, or the delay units are sequentially controlled, so that each discharge unit has the same sum of the equivalent conduction resistance and the equivalent metal wiring resistance, to counteract the uneven conduction of the NMOS transistors that is caused by different metal wiring resistances due to different metal wiring lengths of the NMOS transistors in the discharge units, and improve the conduction uniformity of the discharge units, thereby improving the surge protection capability of the power supply clamping circuit and improving the reliability of the electronic product.

The power supply clamping circuit provided in the present invention may be used in an analog integrated circuit chip. The specific structure of the power supply clamping circuit in the analog integrated circuit chip is not described in detail herein again.

In addition, the foregoing power supply clamping circuit may further be used in a communication terminal as an important component of an analog circuit. The communication terminal described herein is a computer device that can be used in a mobile environment and supports a plurality of communication standards such as GSM, EDGE, TD_SCDMA, TDD_LTE, and FDD_LTE, including a mobile phone, a notebook computer, a tablet computer, an in-vehicle computer, and the like. In addition, the power supply clamping circuit provided in the present invention is also applicable to application scenarios of other analog circuits, for example, a communication base station.

The power supply clamping circuit, the chip, and the communication terminal provided in the present invention are described in detail above. Any obvious modification made by a person of ordinary skill in the art without departing from the essence of the present invention shall fall within the protection scope of the patent of the present invention.

What is claimed is:

1. A surge protection power supply clamping circuit, comprising at least one drive unit and at least one discharge unit, wherein the discharge units are connected to the corresponding drive units respectively, the drive units are connected to a same delay unit, and the delay unit and the discharge units are each connected to a power supply voltage and a ground cable; and
  the drive units or the discharge units are sequentially controlled in a wiring direction of the power supply voltage, so that each discharge unit has the same sum of an equivalent conduction resistance and an equivalent metal wiring resistance.

2. The power supply clamping circuit according to claim 1, wherein
  the delay unit comprises a resistor module and a capacitor module, one end of the resistor module is connected to the power supply voltage, the other end of the resistor module is connected to one end of the capacitor module and input ends of the drive units, and the other end of the capacitor module is connected to the ground cable.

3. The power supply clamping circuit according to claim 2, wherein
  when the drive units are sequentially controlled in the wiring direction of the power supply voltage so that each discharge unit has the same sum of the equivalent conduction resistance and the equivalent metal wiring resistance, each drive unit is formed by an odd number of inverters connected in series, an input end of a first inverter is used as the input end of the drive unit, and an output end of a last inverter is used as an output end of the drive unit;

each discharge unit comprises the same quantity of NMOS transistors, the input ends of the drive units are connected to the other end of the resistor module, the output ends of the drive units are connected to gate electrodes of the NMOS transistors of the corresponding discharge units respectively, drain electrodes of the NMOS transistors are connected, to the power supply voltage, and source electrodes of the NMOS transistors are connected to the ground cable, and sizes of the last inverters in the drive units sequentially increase in the wiring direction of the power supply voltage.

4. The power supply clamping circuit according to claim 2, wherein when the discharge units are sequentially controlled in the wiring direction of the power supply voltage so that each discharge unit has the same sum of the equivalent conduction resistance and the equivalent metal wiring resistance, each drive unit is formed by an odd number of inverters of the same size connected in series, an input end of a first inverter is used as the input end of the drive unit, and an output end of a last inverter is used as an output end of the drive unit;

each discharge unit comprises at least one NMOS transistor, the input ends of the drive units are connected to the other end of the resistor module, the output ends of the drive units are connected to gate electrodes of the NMOS transistors of the corresponding discharge units respectively, drain electrodes of the NMOS transistors are connected to the power supply voltage, and source electrodes of the NMOS transistors are connected to the ground cable; and quantities of the NMOS transistors in the discharge units sequentially decrease in the wiring direction of the power supply voltage.

5. A chip, comprising the power supply clamping circuit according to claim 1.

6. A surge protection power supply clamping circuit, comprising at least one delay unit, at least one drive unit, and at least one discharge unit, wherein the delay units and the discharge units are each connected to a power supply voltage and a ground cable, the delay units are connected to the corresponding drive units respectively, and the drive units are connected to the corresponding discharge units respectively; and the delay units are sequentially controlled in a wiring direction of the power supply voltage, so that each discharge unit has the same sum of an equivalent conduction resistance and an equivalent metal wiring resistance.

7. The power supply clamping circuit according to claim 6, wherein each delay unit comprises a resistor module and a capacitor module, one end of the resistor module is connected to the power supply voltage, the other end of the resistor module is connected to one end of the capacitor module and an input end of the corresponding drive unit, and the other end of the capacitor module is connected to the ground cable.

8. The power supply clamping circuit according to claim 7, wherein the resistor module comprises at least one resistor, and when there are a plurality of resistors, the resistors are connected in series, and the capacitor module comprises at least one capacitor, and when there are a plurality of capacitors, the capacitors are connected in parallel.

9. The power supply clamping circuit according to claim 8, wherein the resistor is replaced with an NMOS transistor or a PMOS transistor that operates in a linear region; and the capacitor is replaced with a MOS capacitor.

10. The power supply clamping circuit according to claim 7, wherein when the delay units are sequentially controlled in the wiring direction of the power supply voltage so that each discharge unit has the same sum of the equivalent conduction resistance and the equivalent metal wiring resistance, each drive unit is formed by an odd number of inverters of the same size connected in series, an input end of a first inverter is used as the input end of the drive unit, and an output end of a last inverter is used as an output end of the drive unit, each discharge unit comprises the same quantity of NMOS transistors, the input ends of the drive units are connected to the other ends of the resistor modules of the corresponding delay units respectively, the output ends of the drive units are connected to gate electrodes of the NMOS transistors of the corresponding discharge units respectively, drain electrodes of the NMOS transistors are connected to the power supply voltage, and source electrodes of the NMOS transistors are connected to the ground cable; and equivalent resistances of the resistor modules in the delay units sequentially increase in the wiring direction of the power supply voltage.

11. The power supply clamping circuit according to claim 7, wherein when the delay units are sequentially controlled in the wiring direction of the power supply voltage so that each discharge unit has the same sum of the equivalent conduction resistance and the equivalent metal wiring resistance, each drive unit is formed by an odd number of inverters of the same size connected in series, an input end of a first inverter is used as the input end of the drive unit, and an output end of a last inverter is used as an output end of the drive unit, each discharge unit comprises the same quantity of NMOS transistors, the input ends of the drive units are connected to the other ends of the resistor modules of the corresponding delay units respectively, the output ends of the drive units are connected to gate electrodes of the NMOS transistors of the corresponding discharge units respectively, drain electrodes of the NMOS transistors are connected to the power supply voltage, and source electrodes of the NMOS transistors are connected to the ground cable, and equivalent capacitances of the capacitor modules in the delay units sequentially increase in the wiring direction of the power supply voltage.

12. The power supply clamping circuit according to claim 7, wherein when the delay units are sequentially controlled in the wiring direction of the power supply voltage so that each discharge unit has the same sum of the equivalent conduction resistance and the equivalent metal wiring resistance, each drive unit is formed by an odd number of inverters of the same size connected in series, an input end of a first inverter is used as the input end of the drive unit, and an output end of a last inverter is used as an output end of the drive unit;

each discharge unit comprises the same quantity of NMOS transistors, the input ends of the drive units are connected to the other ends of the resistor modules of the corresponding delay units respectively, the output ends of the drive units are connected to gate electrodes of the NMOS transistors of the corresponding discharge units respectively, drain electrodes of the NMOS transistors are connected to the power supply voltage, and source electrodes of the NMOS transistors are connected to the ground cable; and equivalent resistances of the resistor modules and equivalent capacitances of the capacitor modules in the delay units simultaneously increase sequentially in the wiring direction of the power supply voltage.

\* \* \* \* \*